United States Patent

Kappeler

Patent Number: 5,946,333
Date of Patent: Aug. 31, 1999

[54] METHOD AND CIRCUIT FOR OPERATING A LASER DIODE

[75] Inventor: Franz Kappeler, Puchheim, Germany

[73] Assignee: Agfa-Gevaert AG, Leverkusen, Germany

[21] Appl. No.: 08/805,992

[22] Filed: Feb. 24, 1997

[30] Foreign Application Priority Data

Mar. 1, 1996 [DE] Germany ............... 196 07 880

[51] Int. Cl.⁶ ...................................... H01S 3/30
[52] U.S. Cl. .................. 372/38; 372/29; 372/32
[58] Field of Search ............... 372/38, 29, 26, 372/32; 250/205

[56] References Cited

U.S. PATENT DOCUMENTS

| | | | |
|---|---|---|---|
| 4,799,069 | 1/1989 | Sasaki et al. | 372/29 |
| 4,819,240 | 4/1989 | Takiguchi et al. | 372/38 |
| 4,835,781 | 5/1989 | Shoji | 372/38 |
| 5,177,755 | 1/1993 | Johnson | 372/38 |
| 5,247,532 | 9/1993 | Levinson | 372/38 |
| 5,313,482 | 5/1994 | Zelenka et al. | 372/38 |
| 5,357,534 | 10/1994 | Yasuda | 372/38 |
| 5,475,210 | 12/1995 | Taguchi et al. | 250/205 |

FOREIGN PATENT DOCUMENTS

568897A1  4/1993  European Pat. Off. .......... H01S 3/06

OTHER PUBLICATIONS

Lima, C.R. & Davies, P.A., "Effects of Extra Low–Frequency Noise Injection on Microwave Signals Generated by a Gain Switched Semiconductor Laser", Applied Physics Letters, 65(8):950–52 (Aug. 22, 1994).

Doev, V.S., Koledov, V.V. & Yu Kuklin, A, "Mode Hopping Noise Reduction by RF Nodulation of the Pump Current of an Injection Semiconductor Laser with an External Cavity", Kvantovaya Elektronika 21(7): 660–664 (1994) (no month available).

*Primary Examiner*—Rodney Bovernick
*Assistant Examiner*—Yisun Song
*Attorney, Agent, or Firm*—Milde, Hoffberg & Macklin, LLP

[57] ABSTRACT

A method for adjusting the intensity of a laser beam which is generated by a laser diode which is controlled by an adjustment signal and a noise signal. A circuit for intensity adjustment for the modulation of a laser beam generated by a laser diode which includes a control means of an adjustment signal, means for generating a noise signal, and means for controlling the laser diode with the noise signal and the adjustment signal.

58 Claims, 6 Drawing Sheets

METHOD AND CIRCUIT FOR OPERATING A LASER DIODE

FIELD OF THE INVENTION

The present invention relates generally to the field of lasers, and more particularly involves a method and circuit for operating a laser diode.

BACKGROUND OF THE INVENTION

Laser diodes are used in many fields of information transmission. Laser diodes are well suited for modulating the generated laser beam with respect to its intensity. As a result of their small size and their easily implemented electronic controlling, laser diodes can attain very high data transmission rates. This is especially advantageous both in the transmission of messages as well as in the recording and reproducing of information.

One problem exists with laser diodes, however, in their characteristic of spontaneously jumping between different modes within certain brightness ranges. This effect is known as mode hopping. If laser diodes are being used for the scanning or recording of information on a data carrier such as photographic film, mode hops can occur with the laser diodes as a result of optical reflexes that arise from surfaces in the beam path which have not been perfectly dereflected, or at the surface of the film that is to be exposed. In combination with the partially reflective light emission surface of the laser diode, this reflection location forms an external resonator whose resonant frequencies (i.e. Fabry-Perot modes) are determined by the propagation time of the light wave from the laser mirror to the reflection location and back. For an impact point that is at a distance $L_{ext}$, resonances with a frequency interval (i.e. mode interval) of $df_{ext}=c/(2 \cdot L_{ext})$, where $c=3 \cdot 10^{10}$ cm/s which describes the speed of light.

With an external resonator of 30 cm, for example, the interval of the external resonant frequencies is 500 MHz. In this case, the oscillation frequency of a laser diode would hop back and forth unpredictably among several of these resonant frequencies, with each mode hop linked with an abrupt change in the laser power.

Several solutions have already been suggested in order to prevent these mode hops. By way of example, U.S. Pat. No. 4,817,098 discloses a regulating system in which the laser power is kept constant by means of various measures. One way is to measure the temperature of the laser diode in order to avoid hops. Another way is to keep the laser diode temperature fluctuations as small as possible by means of temperature control, and thus achieve a light output of the laser diode that is as uniform as possible. U.S. Pat. No. 5,283,793 teaches a high-frequency signal to be superimposed on the image signal to prevent mode hops. In addition, U.S. Pat. No. 4,799,069 and U.S. Pat. No. 5,386,124 discloses that the laser diodes be switched off briefly between two image signals in order to avoid mode hops.

From the state of the art described above, it is known that the occurrence of mode hops can be suppressed by means of a high-frequency modulation of the laser diode current with a periodic signal. As a result of the periodic modulation, the spectrum of the modulated laser light exhibits a number of discrete side lines at the interval of the modulation frequency.

Experimental studies have now shown that effective suppression of mode hops with periodic modulation occurs only if the frequency interval of the modulation side lines exactly corresponds to the frequency interval of the external resonator modes, or at least amounts to an integer fraction of this mode interval. In accordance with that, in the case of periodic modulation the modulation frequency, $f_M$ must be exactly matched to the frequency interval $df_{ext}$ or an integer fraction of the same (i.e. $f_M=df_{ext}/n$). This matching is technically difficult, and in addition, it differs from device to device. A serious disadvantage of the periodic modulation technique is due to the fact that an effective suppression of the mode hops which occur is only possible if several reflection locations are present in the beam path of a device at varying distances to the laser diode.

SUMMARY OF THE INVENTION

It is therefore an object of the invention to provide a method and a circuit for operating a laser diode by means of which an effective suppression of mode hops is possible without special matching measures, even if several refection locations are present.

This is achieved in a method for the intensity adjustment of a laser beam generated by a laser diode, the method comprises controlling the laser diode with an adjustment signal, and controlling the laser diode with a noise signal.

In addition, this is achieved in a circuit for intensity adjustment for the modulation of a laser beam generated by a laser diode, the circuit having a control means of an adjustment signal, means for generating a noise signal, and means for controlling the laser diode with the noise signal and the adjustment signal.

The invention provides for controlling a laser diode by means of a broadband band-pass noise signal in addition to an intensity adjustment signal. The spectrum of this nonperiodic random signal is a continuous spectrum in which all frequencies from a lower limit frequency $f_u$ to an upper limit frequency $f_o$ occur with substantially the same amplitude. As a result, the spectrum of the noise-modulated laser light exhibits continuous side bands in which all frequencies are represented equally. Because of this continuous spectral distribution, there also existed side-band frequencies such that they match with the resonant frequencies of a parasitic external resonator. The active laser diode now amplifies the energy that is available at the external resonant frequencies to such an extent that undamped laser oscillations finally occur at these frequencies. A noise modulation of such a type thus brings about the fact that the light power generated by the laser diode is distributed over a large number of modes of the external resonator in a uniform and temporally stable fashion. In this way, the occurrence of mode hops and the abrupt changes in power which are associated with them is largely suppressed.

To superimpose the noise signal on the adjustment or modulation signal (i.e. measurement signal), a frequency-selective superpositioning circuit is provided. It acts as a low-pass for the useful signal, and as a high-pass for the noise signal. From these two signals, a superpositioning signal is formed, preferably additively, by means of which the laser diode can be regulated.

Through the use of the method of noise modulation in accordance with the invention, it is ensured, with no special matching measures, that the condition mentioned above for the optimum suppression of mode hops is met. This also holds true for the case in which several external resonators with different mode hops are present, as long as the resonant frequencies in question lie within the bandwidth of the optical spectrum. In addition, as a result of the superpositioning of the noise signal on the adjusting signal, the percentage of usable light power is relatively high in comparison with the blanking method which is already known.

In the case of a semiconductor laser, the bandwidth of the optical spectrum is substantially greater than twice the bandwidth of the noise signal, since with the direct modulation of the semiconductor lasers, a strong frequency modulation (FM) occurs along with an amplitude modulation (AM). The bandwidth, B, of the optical spectrum is determined by the product of the so-called frequency modulation efficiency $S_{FM}$ of the laser diode and by the effective value, $I_{eff}$ of the noise current (i.e. $B=S_{FM} \cdot I_{eff}$). Because of this interrelationship, a simple condition for the effective suppression of mode hops by means of noise suppression can be given. If $L_{ext}$ is the distance between the laser diode and the first optically effective surface (reflection location) then a noise current with the effective value $I_{eff} > c/(S_{FM} \cdot L_{ext})$ is especially effective for the suppression of mode hops. With this dimensioning, all mode hops that are brought about by reflection locations that are moire distant are also suppressed. The frequency modulation efficiency of laser diodes normally lies in the range between $S_{FM}$=100 MHz/mA and $S_{FM}$=500 MHz/mA. At a typical value of $S_{FM}$=200 MHz/mA, for example, a noise current with an effective value of at least 5 mA is especially effective for a resonator that is 30 cm long. Since the effective value of a noise volume is proportional to the root of the product of the bandwidth and the spectral power density, both broadband noise with low power density and narrow-band noise with high power density can be used for noise modulation. This fact is confirmed by experimental studies in which the suppression of the mode hops occurred at an effective noise current of approximately 5 mA (see FIG. 5), independently of the noise bandwidth (6 MHz or 50 MHz).

For a full understanding of the present invention, reference should now be made to the following detailed description of the preferred embodiments of the invention as illustrated in the accompanying drawings.

BRIEF DESCRIPTION OF THE DRAWINGS

Various embodiments of the present invention are described and illustrated herein with reference to the drawings in which like items are indicated by the same reference designation, in which.

DETAILED DESCRIPTION OF THE INVENTION

Figure 1:
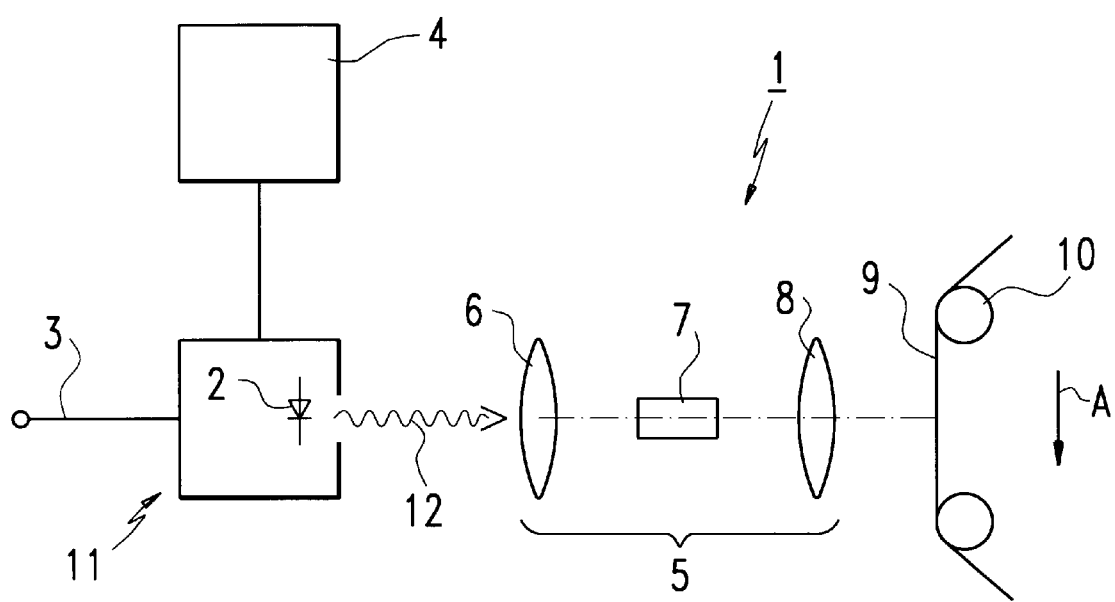
FIG. 1 is a schematic diagram of a laser recording device.

Turning now to FIG. 1, there is shown a schematic diagram of a laser recording device. Image signals are being recorded on a photographic film 9 by means of a laser printer 1. The continuous-tone gray-stage image signals are present at an image signal line 3. They are converted into control signals for a laser diode 2 in an electronic control device 11. The laser diode 2 generates a laser beam 12 which is brightness-modulated in accordance with the image signal and which has a power $P_A(t)$ that is modulated as a function of time. For example, the image signals can come from a charge-coupled device (CCD) original-image scanner, or even from a medical diagnostics device such as a CT, NMR, or ultrasound device. Image signals can represent monochrome or even color images. The image signals contain frequencies from zero (direct current) to about 10 MHz. The high-frequency noise signal generated by a noise generator 4 is present at a second input of the electronic control device 11. The spectrum of this signal extends from a lower limit frequency $f_u$ to an upper limit frequency $f_o$ (band-pass noises). The lower limit frequency is selected high enough that interfering exposure of the photographic film 9 no longer occurs (typically $f_u$>=10 MHz), which means that it is higher than the upper limit frequency $f_g$ of the image signal. The upper limit frequency $f_o$ is determined by the noise generator 4, and lies in the range from 50 to 200 MHz. Image signal and noise signal are superimposed additively in the electronic control device 11 by means of a frequency-selective filter circuit, and are sent to the laser diode 2 as a modulation current. The intensity of the laser beam 12 changes proportionally to the sum of the image signal and the noise signal. While the relatively low-frequency modulation of the laser beam by the image signal brings about a corresponding exposure of the photographic film 9, the high-frequency noise modulation is not reproduced by the film layer. The noise modulation is thus used only for the suppression of the mode hops, and has no negative effects on the image quality. The intensity-modulated laser beam 12 is directed onto the photographic film 9 by means of an optical system 5. The photographic film 9 is transported in an advance direction A which is perpendicular to the dispersion direction of the laser beam 12 by means of a drive 10. At the same time, the laser beam 12 is deflected inside the optical system 5 by means of a deflection element 7, such as a polygonal mirror, oscillating mirror, or a hologram disk, onto the film surface perpendicular to the transport direction A. As a result, a two-dimensional exposure can be attained on the photographic film 9. For the exact focussing of the laser beam 12 on the photographic film 9, the optical system 5 includes a first focussing lens 6 ahead of the deflection element 7, and a second focussing lens 8 after the deflection element 7. Scan arrangements of such a type are very well known, some with several lens systems ahead of or after the deflection element.

Figure 2A:
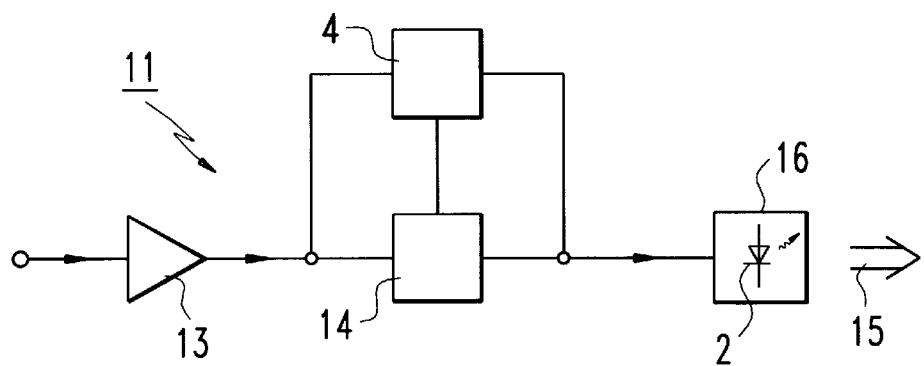
FIG. 2, comprised of FIGS. 2a, 2b and 2c, are schematic diagrams for the basic options for the superpositioning of an intensity adjustment signal and a noise signal for the modulating of a laser diode.
Figure 2B:
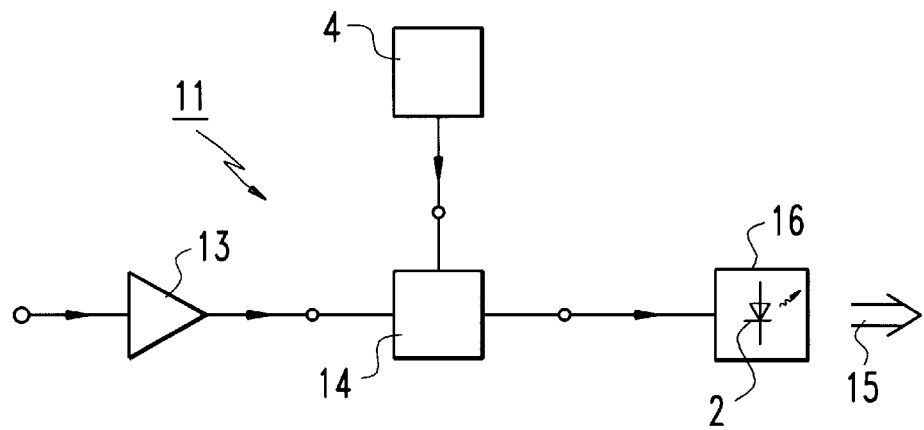

Turning now to FIG. 2, there is shown schematic diagrams for basic options for the superpositioning of an intensity adjustment signal and a noise signal for the modulating of a laser diode. Two variants, FIG. 2a and FIG. 2b, for the additive superimposing of a noise signal on an intensity adjustment signal inside the electronic control device 11 are depicted. The adjustment signal can typically be a modulation image signal or a static adjustment signal. The electronic control device 11 contains an image signal amplifier 13, a frequency-selective superpositioning circuit 14, as well as the noise generator 4.

In the arrangement according to FIG. 2a, the image signal amplifier 13 and the noise generator 4 are connected in series with the laser module 16 that is to be controlled (voltage superpositioning). The frequency-selective positioning circuit 14 prevents any mutual influencing of the two signal sources. Placed inside the laser module 16 is the laser diode 2 which generates the laser beam 15.

FIG. 2b shows the image signal amplifier 13 and the noise generator 4 connected in parallel with the laser module 16. The current superpositioning of the two signal sources for the image signal and the noise signal is especially favorable in terms of the high-frequency engineering, in conjunction with which a suitable coupling filter (a so-called bias tee, for example) prevents any crosstalk between the two signal sources in this case. Placed inside the laser module 16 is the laser diode 2 which generates the laser beam 15.

Figure 2C:
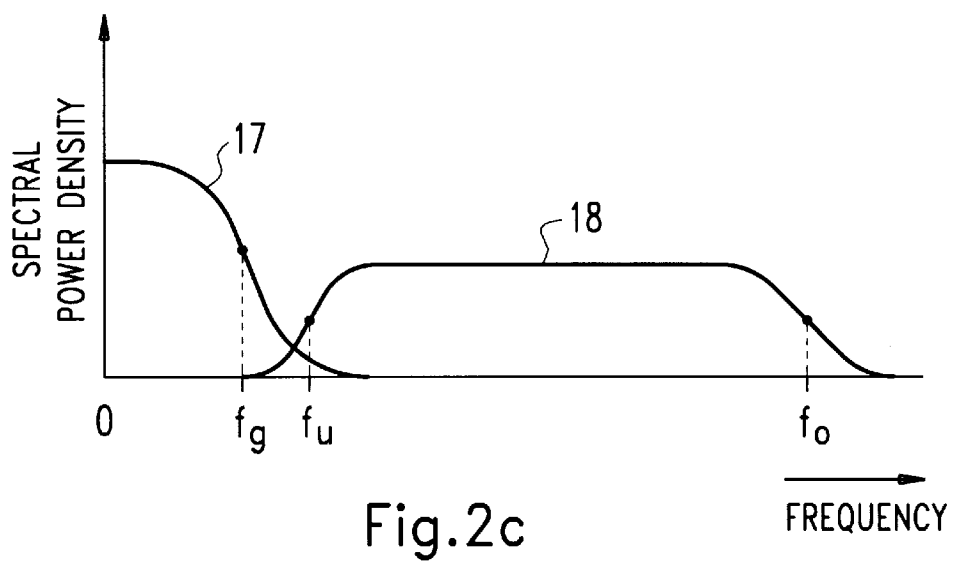

In FIG. 2c, the power spectra of the image signal 17 and the noise signal 18 are recorded as a function of frequency. For the reasons which have already been mentioned above, the lower limit frequency $f_u$ of the noise signal 18 must be somewhat higher than the upper limit frequency $f_g$ of the image signal 17. The upper limit frequency $f_o$ is determined by the noise generator 4.

Turning now to FIG. 3, there is shown several special forms of implementation of the frequency-selective super-positioning circuit 14 for the circuit variants shown in FIGS. 2a and 2b. In FIG. 3, the image signal amplifier 13 is shown as a voltage source which is controlled by the image signal and which has an internal resistance $R_B$, and the noise generator 4 as a voltage source with internal resistance $R_R$. The image signal is present at the input 24 of the image signal amplifier 13. The greatly simplified equivalent circuit diagram of the laser module 16 consists of an ideal laser diode 2 and a series resistance $R_L$. Typical values of $R_L$ lie in the range from 2 to 5 ohms. Since the internal resistances of the signal sources are substantially higher (50 ohms to 10 kilo-ohms), both signal sources 4, 13 act as current sources for the laser diode 2. This current control is desirable, since the laser power is proportional to the instantaneous value of the operating current.

Figure 3A:
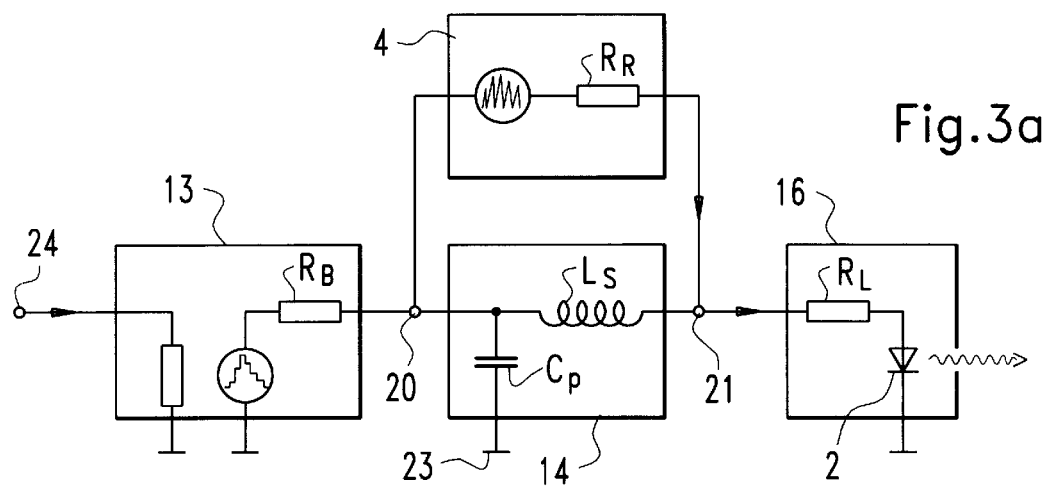
FIG. 3, comprised of FIGS. 3a, 3b, and 3c, are schematic diagrams of illustrative embodiments for the implementation of the superimposing of signals.
Figure 3B:
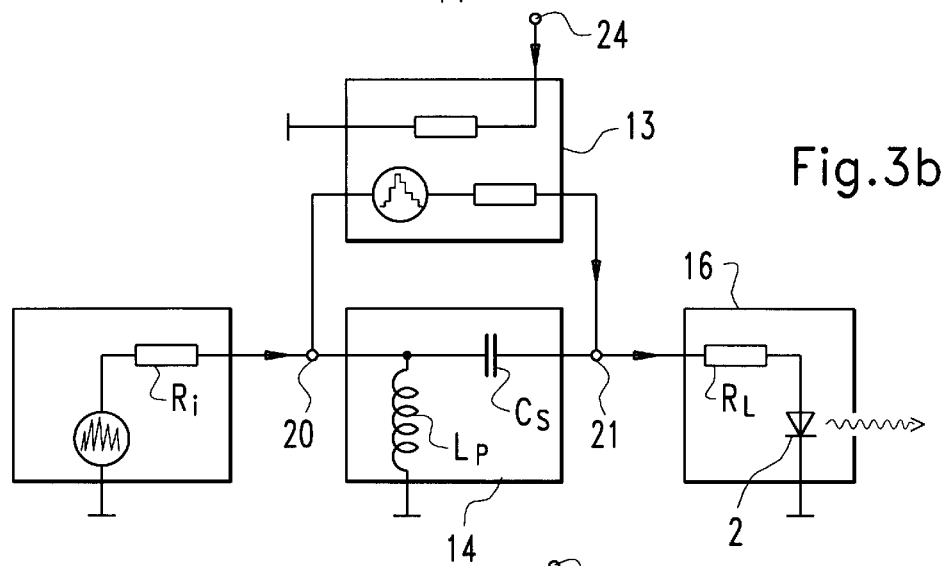

FIGS. 3a and 3b depict two illustrative embodiments for the implementation of the superimposing of signals involving series coupling according to FIG. 2a. The series coupling causes an adding of the two signals in the frequency-selective superpositioning circuit 14. The superpositioning variants are based on the elementary properties of inductances and capacitances. An inductance causes a short circuit for signals of lower frequencies, and an open circuit for signals with a higher frequency, while a capacitance causes an open circuit for signals with lower frequencies and a short circuit for higher frequencies.

In the circuit according to FIG. 3a, the image signal amplifier 13 is connected to a ground on one side, while the noise generator 4 is connected ground-free to points 20, 21. In this case, the frequency-selective superpositioning circuit 14 consists of a parallel capacitance, $C_p$ and a series inductance $L_S$. $C_p$ short circuits the output voltage of the image signal amplifier 13 for high frequencies that is present at input 20 of the frequency-selective superpositioning circuit 14, and thus connects the high-frequency noise voltage on one side to a ground via point 23. Thus, at high frequencies the full noise voltage is present at the laser module 16 via point 21, while at the same time a discharge of noise power into the image signal loop via point 20 is prevented. At low frequencies, $L_s$ short circuits the noise voltage and allows the relatively low frequency image signal to pass with no weakening. At low frequencies, only the image signal voltage is present at the laser module 16, without any signal power being lost in the noise generator 4. The frequency-selective superpositioning circuit 14 thus acts as a low-pass for the image signal and as a high-pass for the noise signal. The cut-off frequency, $f_c$ of this coupling filter is determined by the values of $C_p$ and $L_S$ and optimally lies at $f_c = \frac{1}{2} \cdot (f_g + f_u)$. With this dimensioning, any mutual influencing of the two signal sources 4, 13 is avoided, and a frequency-selective transmission of image signal or noise signal to the laser diode 2 is ensured. The separating effect of the frequency-selective positioning circuit 14 acts as a coupling filter and can be improved if higher order filter elements are used for $L_s$ and $C_p$ in a known manner.

In the illustrative embodiment according to FIG. 3b, the noise generator 4 is operated to a ground, while only the image signal amplifier 13 is connected in a ground-free manner. This arrangement is more favorable than the illustrative embodiment according to FIG. 3a in terms of high-frequency engineering. Accordingly, the frequency-selective positioning circuit 14 acts as a coupling filter and consists of a parallel inductance $L_p$ and series capacitance $C_s$. With regard to the manner of working and the dimensioning of the coupling filter 14, the same holds true as in the illustrative embodiment according to FIG. 3a.

Figure 3C:
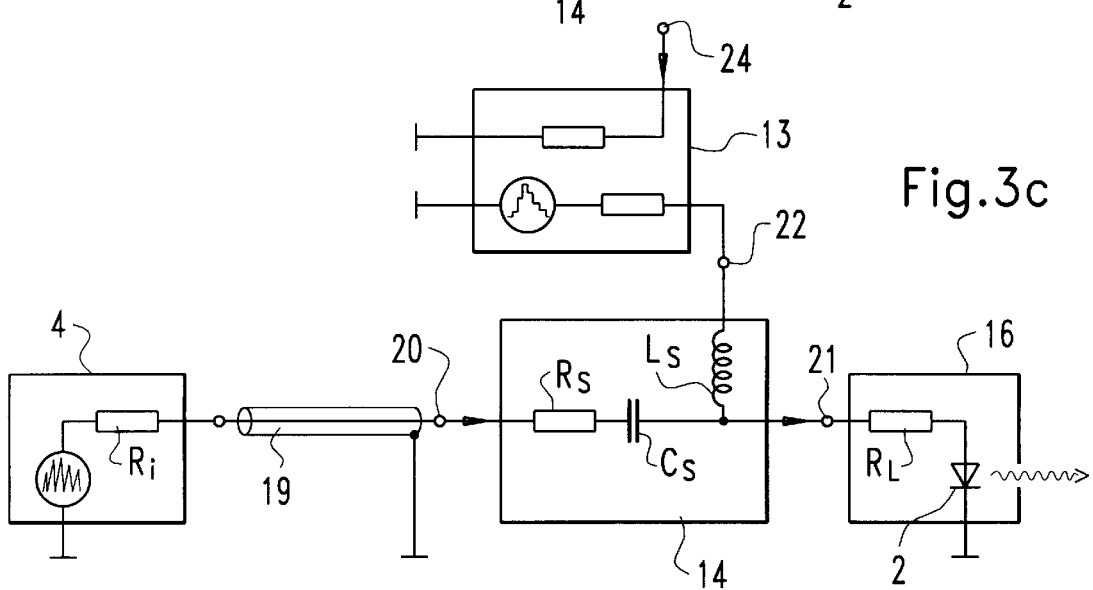

Turning now to FIG. 3c, this shows a circuit arrangement in which the two signal sources 4, 13 are connected in parallel on the output side, that is, the signals are superimposed as current signals. This arrangement is the most favorable in terms of high-frequency engineering, since both the noise generator 4 and the image signal amplifier 13 can be operated to a ground. As a result, the harmful effect of parasitic inductances and capacitances on the frequency responses of the two signal sources is minimized. With this parallel connection, which corresponds to FIG. 2b, the frequency-selective superpositioning circuit 14 consists of a series inductance $L_s$ in the low-frequency branch (image signal) plus the capacitance $C_S$ in series with a matching resistance $R_S$ in the high-frequency branch (noise signal). The low-frequency image signal goes via $L_s$ to the laser module 16 via point 21, and is blocked off by $C_s$ from the image signal amplifier 13 which is present at the input 22 of the frequency-selective superpositioning circuit 14. The high-frequency noise signal is supplied to the laser module 16 via $C_s$ and is decoupled from the image signal amplifier 13 via $L_s$. The resistance $R_s$ is used for matching the laser diode impedance to the characteristic impedance $Z_w$ of a coaxial cable 19 (or a microstrip or stripline conductor) on which the high-frequency noise signal is being supplied. The matching condition for the noise signal is the following: $R_s + R_L = Z_w$. In the matching, the noise generator 4 can be connected with the rest of the circuit by a longer conductor without standing waves occurring between the noise generator 4 and the laser module 16, which lead to an unwanted radiating of high-frequency radiation. Through the use of a bias tee that is matched in terms of high-frequency engineering, it is also possible to place the noise generator 4 so it is physically separated from the rest of the control circuit components. In addition, the perturbing radiation level is substantially reduced by this matching.

Figure 4:
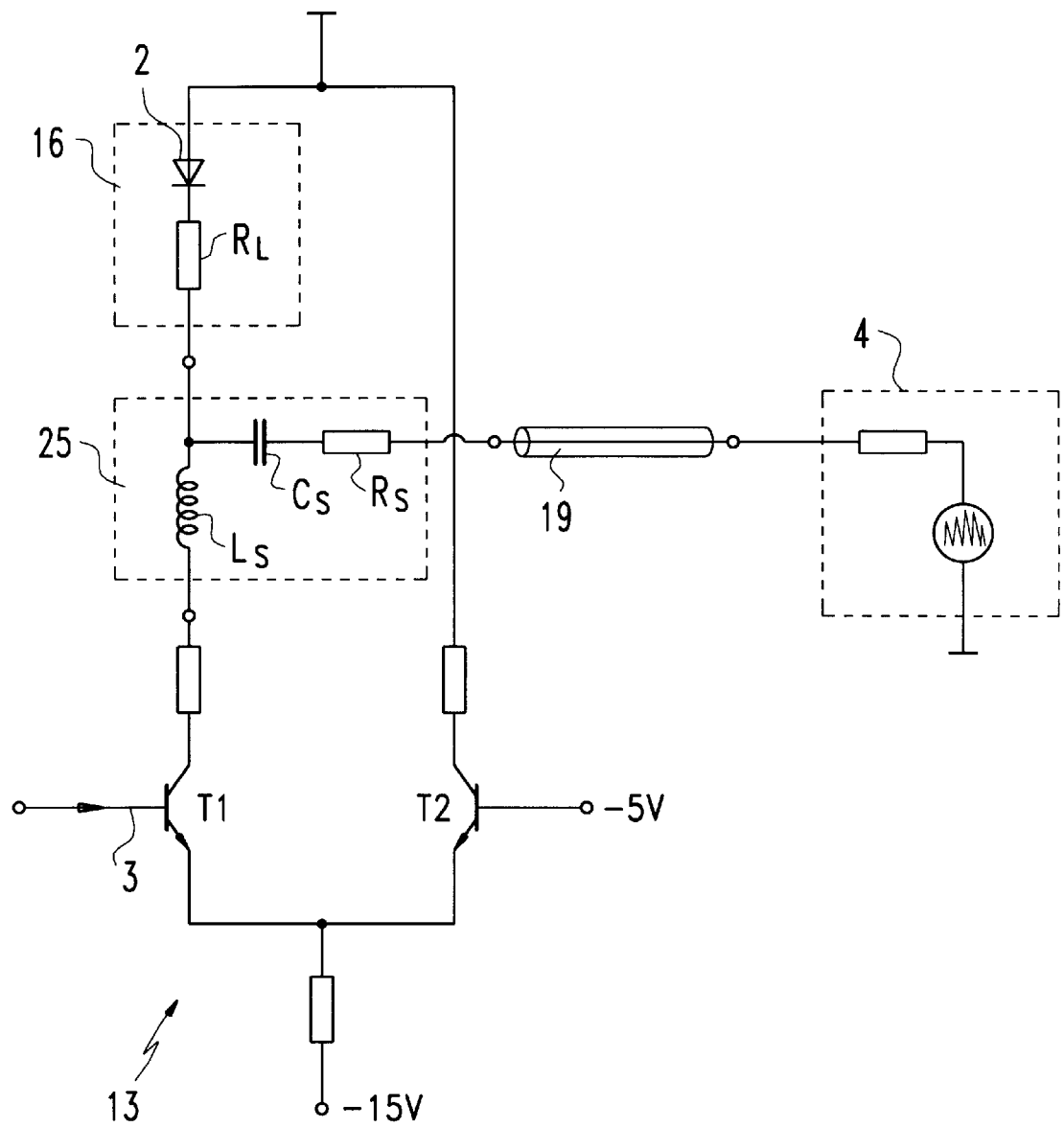
FIG. 4 is another schematic diagram of an illustrative embodiment for the implementation of the superimposing of signals.

Turning now to FIG. 4, this shows an example of the parallel coupling with matched bias tee circuit 25 in accordance with FIG. 3c. The image signal amplifier 13 for the image signal that is present on conductor 3 is implemented as a differential amplifier. The laser module 16 has a laser diode 2 with a serial resistance $R_L = 3$ ohms and forms a part of the collector resistance of transistor T1. The image signal controls the base of T1, while the base of T2 has a fixed reference voltage applied to it. The noise power generated by the noise generator 4 is supplied to the laser diode 2 by means of a coaxial cable 19 with characteristic impedance $Z_w = 50$ ohms and a matched bias tee. The bias tee exhibits, as previously in the FIGS. 3, a capacitance $C_s$ and an inductance $L_s$ for the frequency-selective signal superpositioning. In this example, the matching resistance $R_s$ has a value of 47 ohms, so the matching condition (i.e. $Z_w = R_s + R_L$) is met.

Figure 5A:
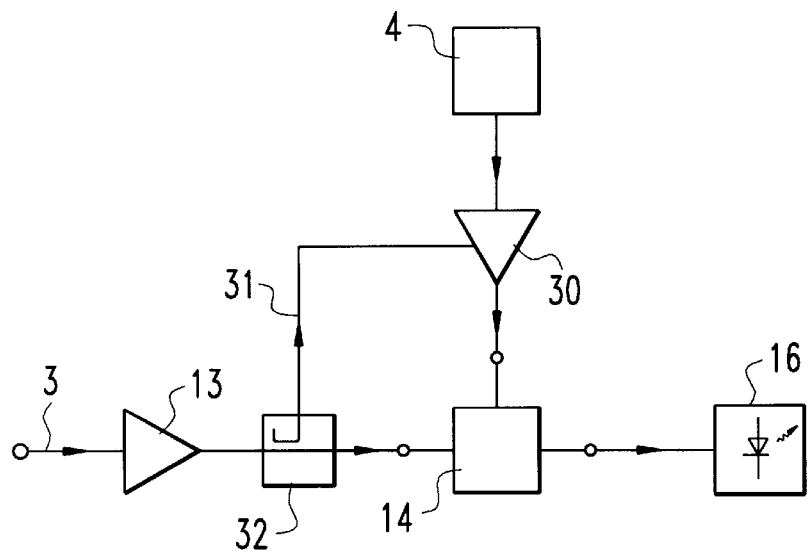
FIG. 5, comprised of FIGS. 5a, 5b, and 5c, are schematic diagrams of further illustrative embodiments for the implementation of the superimposing of signals.
Figure 5B:
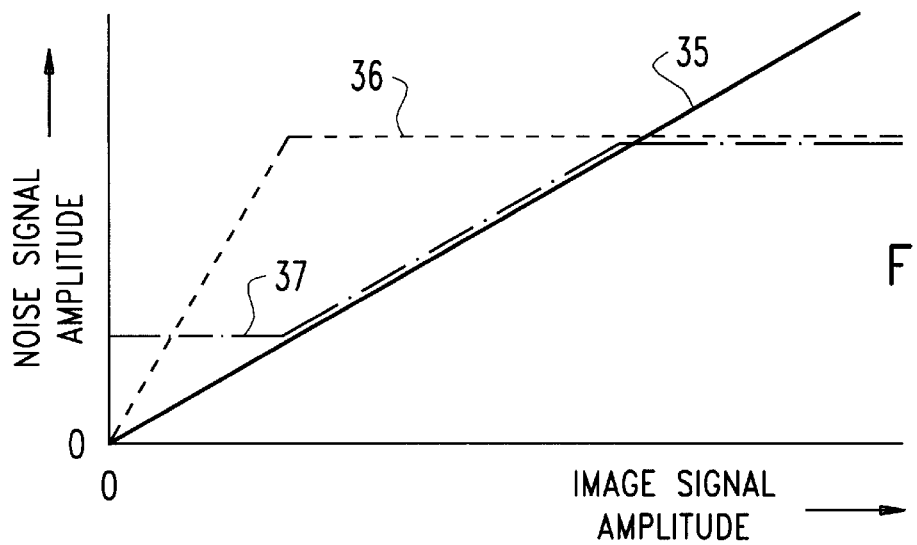

Shown in FIG. 5 is another advantageous variant of a noise modulation circuit. In accordance with FIG. 5a, the output signal of the noise generator 4 is amplified in a subsequent noise signal amplifier 30 in a regulated manner in dependency on the amplitude of the image signal. To do that, a portion of the image signal is decoupled via the coupler 32 and the conductor 31, and is supplied to the control input of the noise signal amplifier 30. By doing this, the noise current is controlled in accordance with a pre-specified characteristic curve by the amplitude of the image signal. The noise signal which has been amplified in this way is then sent to the frequency-selective superpositioning circuit 14, and from there to the laser module 16. It is helpful to vary the effective value of the noise signal proportionally to the amplitude of the image signal in accordance with the characteristic curve 35 in FIG. 5b. In this way, at high light power, that is, where mode hops are especially detrimental, mode hops are suppressed with great certainty due to the strong noise modulation, while at low light power in the range of lasing threshold, any overmodulating of the laser diode is prevented by the noise signal. Depending on the particular application, it can also be expedient to limit the noise power to a maximum value starting at a specific image signal amplitude (characteristic curve 36), or to provide both a maximum value and a minimum value for the noise power (characteristic curve 37).

Figure 5C:
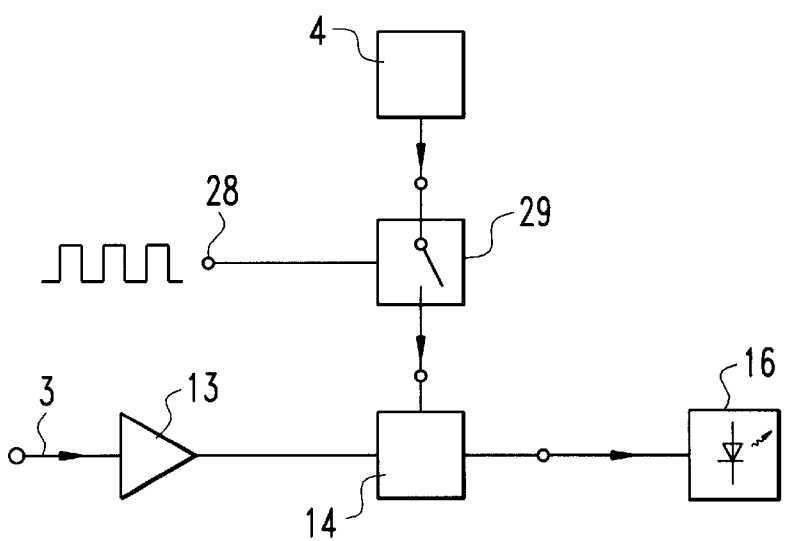

FIG. 5c shows an additional form of implementation for the signal superpositioning. Image signal and noise signal are now added in the frequency-selective superpositioning circuit 14, and the sum signal is sent to the laser module 16. In this embodiment, however, the noise signal is not applied to the frequency-selective superpositioning circuit 14 constantly, but is intermittently interrupted by means of the switch 29. To do that, the switch 29 is controlled with a timing signal via input 28. The clock frequency of this signal can be matched depending on the particular circumstances, and can lie between 1 kHz and several MHz. It is preferable for the control signal to have a rectangular for and it is generated by a clock generator that is known per se. As an alternative to the switch 29, the noise signal amplifier 30 shown in FIG. 5a which is controlled by the image signal can also be additionally operated with the switched control signal by means of a suitable comparator, so that a switched image signal modulated noise signal is present at the frequency-selective superpositioning circuit 14.

Figure 6A:
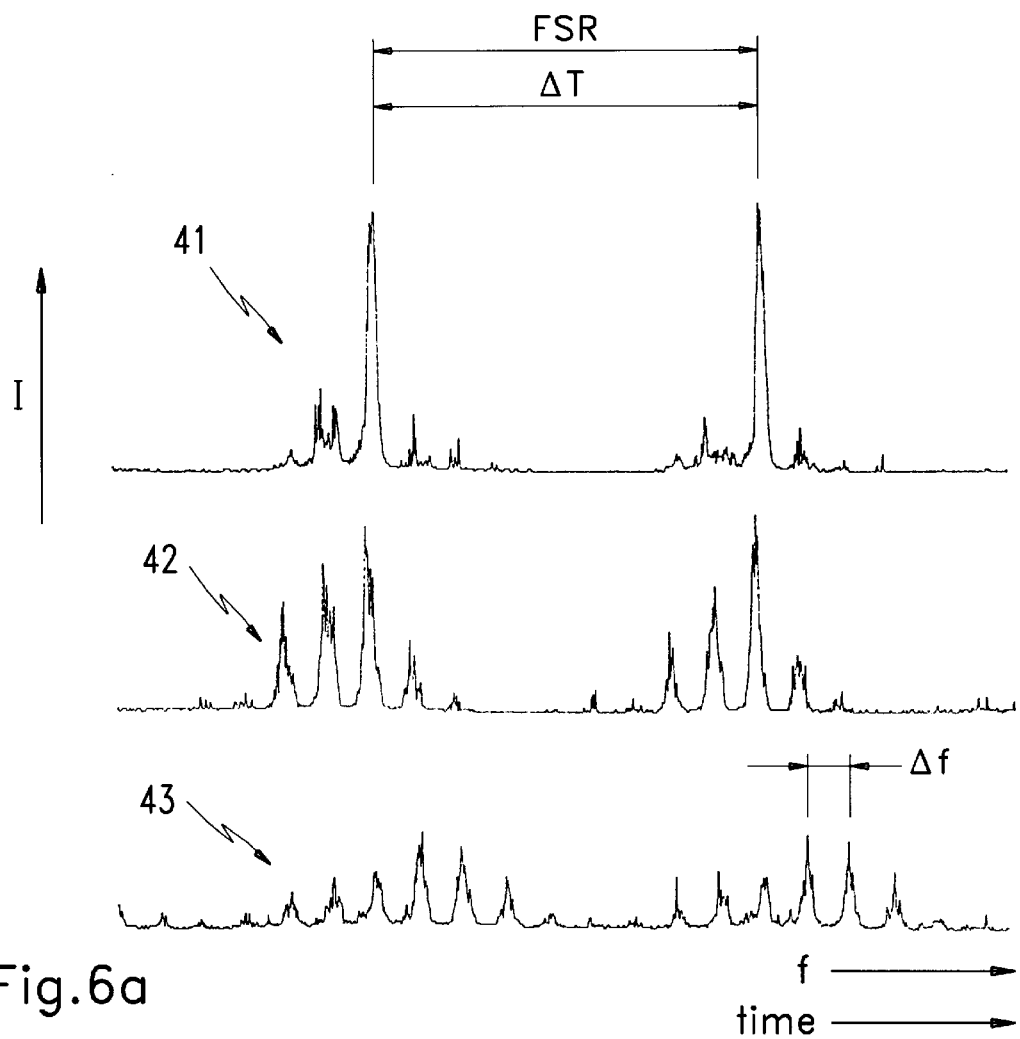
FIG. 6, comprised of FIGS. 6a and 6b, are diagrams of the measured mode spectra of a noise-modulated laser diode.

Turning now to FIG. 6, there is demonstrated the effect of noise modulation on the mode spectrum of a monomode laser diode in accordance with the invention that is being disturbed by optical feedback. The optical spectra were measured using a Fabry-Perot interferometer with a free spectral range (FSR) of 4.95 GHz. The interferometer was swept through two free spectral ranges during each measuring pass. Each of the measurement curves therefore shows two mode groups at an interval of 4.95 GHz, in conjunction with which the temporal interval $\Delta T$ between the two sub-spectra amounts to approximately 8 ms. The spectra 41, 42 and 43 in FIG. 6a were generated by modulation with a noise bandwidth $B_R$=6 MHz, in conjunction with which the effective value $I_{eff}$ of the noise current was increased with each measurement. For spectrum 41, $I_{eff}$=1.6 mA, for spectrum 42, $I_{eff}$=2.9 mA, and for spectrum 43, $I_{eff}$=5.1 mA. It can be clearly seen that with increasing effective value, more and more external resonance frequencies are being excited at an interval $\Delta f$ of approximately 520 MHz. The occurrence of mode hops in the spectra 41 and 42 can be seen by the fact that the two sub-spectra of a measurement pass exhibit markedly different mode distributions. This means that within a period of about 8 ms, the spectral energy distribution of the laser diode is changed markedly, and as a result, low-frequency mode hopping noise occurred. In these measurements, the noise modulation was apparently too low to suppress the mode hopping. In contrast to that, the two mode groups of spectrum 43, which was recorded at a noise current of 5.1 mA, show a great similarity to one another. At this value for the noise current, the laser spectrum remains stable through one measurement pass, and apparently, mode hops are no longer occurring. According to that, for the laser that is being studied here the minimum value of the noise current needed for the suppression of mode hops is about 5 mA.

Figure 6B:
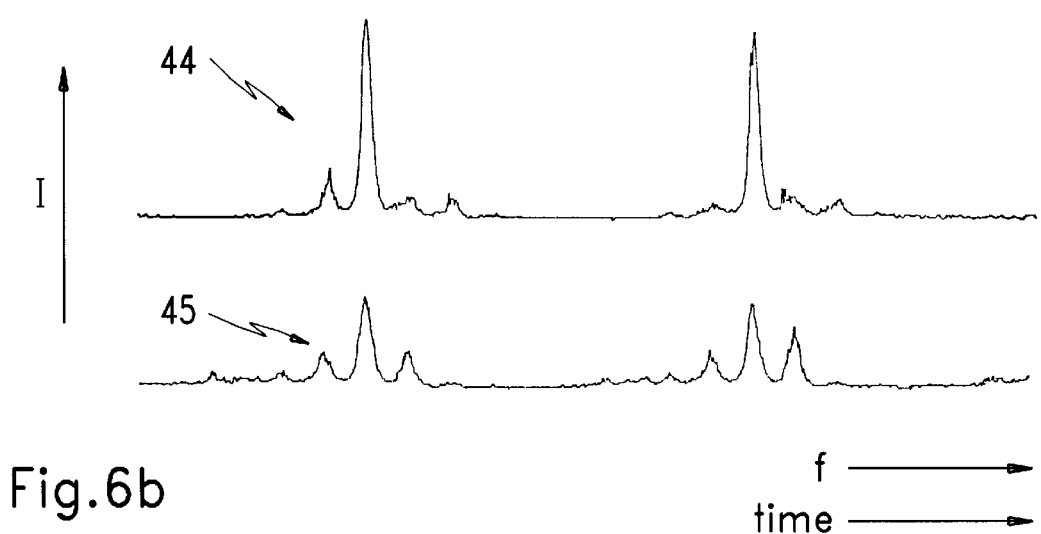

Spectra 44 and 45 of FIG. 6b were measured at a bandwidth of 50 MHz. Here as well, it appears that at noise currents that are too low ($I_{eff}$=1.6 mA in spectrum 44), severe fluctuations occur in the mode spectrum, while with the reaching of certain minimum value ($I_{eff}$=5.2 mA in spectrum 45), the laser spectrum exhibits a stable multimode structure versus time. Worth of note in this regard is also the fact that the experimentally determined minimum value of the noise current is the same for both bandwidths.

For the recording of medical images, the image signals usually exhibit frequencies in the range of several MHz. In order to avoid disturbing reciprocal effects between the image signal and the noise signal, the lower limit frequency of the noise signal is higher than the upper limit frequency of the image signal. By way of example, if the image signal frequencies are in the range between 10 kHz and 10 MHz, the lower limit frequency of the noise signal is above 10 MHz, preferably by at least a factor of 2, which means 20 MHz. If by contrast images are only sampled, such as in the case with the reading out of exposed medical phosphor films, the laser adjustment signal is a static signal. In that case the noise signals can already begin at a lower limit frequency of zero.

Embodiments of the invention were described along with their effects on the recording of image signals in photo-graphic film. In conjunction with that, it is clear that within the framework of the knowledge of one skilled in the art, other applications such as video displays or similar things can be provided, and diverse modifications and alternative embodiments of the invention can be provided with little effort. In particular, it can be advantageous to combine the present invention with other known methods or devices for avoiding mode hops. For example, in German Patent Application No. 196 07 877 of the applicant, filed Mar. 1, 1996, and in the corresponding International Patent Application No. PCT EP97 00814, filed Feb. 20, 1997, (which applications are incorporated herein by reference) it was described how to create a so-called "coherence collapse" in the laser diode. That method can be advantageously combined with the present method for noise modulation. In particular, by the method using coherence collapse, the output of a laser diode can be stabilized within signal regions of low frequencies while by the method of superimposing a noise signal, the laser diode output can be stabilized within high frequency regions which lie above the upper limit frequency $F_g$ of the laser diode adjustment signal. In the case of the coherence collapse, it is provided that light which comes from a laser diode is at least partially coupled back into the active zone of the laser diode. For example, for that purpose a small portion of the light coming from the laser diode is reflected from an external mirror and is directed back into the laser resonator by means of suitable optics. Together with the external mirror, the light emission surface of the laser diode thus forms an external resonator, the length of which is substantially greater than the resonator length of the laser. The main portion of the light coming from the laser diode can be used for impinging on a medium, e.g., for image recording on a film.

There has thus been shown and described a novel method and circuit for the operation of a laser diode which fulfills all the objects and advantages sought therefor. Many changes, modifications, variations and other uses and applications of the subject invention, will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention, which is limited only by the claims which follow.

What is claimed is:

1. A method for the intensity adjustment of a laser beam generated by a laser diode, the method comprising the steps of:
    controlling the laser diode with an adjustment signal; and
    controlling the laser diode with a noise signal,
    wherein the noise signal exhibits an effective current strength $I_{eff}$ in which $I_{eff} > c/(S_{FM} \cdot L_{ext})$ where c designates the speed of light, $S_{FM}$ designates the frequency modulation efficiency of the laser diode, and $L_{ext}$ designates the distance between the laser diode and the first, at least partially reflective surface outside the laser diode which acts upon the laser beam.

2. The method according to claim 1 wherein the adjustment signal is a static signal.

3. The method according to claim 1 wherein the adjustment signal is a modulation signal.

4. The method according to claim 1 wherein the noise signal is a band-pass signal having lower limit frequency ($f_u$) that is greater than an upper limit frequency ($f_g$) of the adjustment signal.

5. The method according to claim 1 further comprising the step of additively superimposing the adjustment signal and the noise signal to form a sum signal in a frequency-selective superpositioning circuit.

6. The method according to claim 5 further comprising the step of controlling the laser diode with the sum signal.

7. The method according to claim 5 wherein during the superimposing step, the noise signal and adjustment signal are superimposed serially (as a voltage signal) in the frequency-selective superpositioning circuit.

8. The method according to claim 5 wherein during the superimposing step, the noise signal and adjustment signal are superimposed in parallel in the frequency-selective superpositioning circuit.

9. The method according to claim 1 further comprising the steps of additively superimposing the adjustment signal of a predetermined first frequency range and the noise signal of a predetermined second frequency range to form a sum signal in a frequency-selective superimposing circuit, and controlling the laser diode with the sum signal.

10. The method according to claim 9 wherein during the superimposing step, the noise signal and adjustment signal are superimposed serially (as a voltage signal) in the frequency-selective superpositioning circuit.

11. The method according to claim 9 wherein during the superimposing step, the noise signal and adjustment signal are superimposed in parallel in the frequency-selective superpositioning circuit.

12. The method according to claim 1 wherein the noise signal is clocked as a function of time before it is sent to the laser diode.

13. The method according to claim 1 where controlling the adjustment signal comprises the step of directing the laser beam onto a specifically photographic, light-sensitive recording material for the recording of image information in accordance with the adjustment signal.

14. The method according to claim 1 wherein light coming from the laser diode is partially coupled back into the active zone of the laser diode.

15. The method according to claim 1 wherein the noise signal amplification is controlled by an image signal.

16. The method according to claim 15 wherein the control is carried out with a predetermined characteristic curve in dependency on the amplitude of the image signal.

17. A circuit for intensity adjustment of a laser beam generated by a laser diode comprising:
    means for producing an adjustment signal;
    means for generating a noise signal; and
    an input signal amplifier, receiving as an input the adjustment signal, the output of which is connected to a first input of a superpositioning means, and a second input of the superpositioning means being connected with the means for generating the noise signal, said superpositioning means controlling the laser diode.

18. The circuit according to claim 17 wherein the controlling means includes a frequency-selective circuit with a low-pass for the adjustment signal and a high-pass for the noise signal and a means for the additive superimposing of the adjustment signal on the noise signal.

19. The circuit according to claim 17 wherein the input signal amplifier is connected across a constant reference potential equal to ground.

20. The circuit according to claim 17 wherein the means for generating the noise signal is connected across a constant reference potential equal to ground.

21. The circuit according to claim 17 further including a noise signal amplifier for the noise signals.

22. The circuit according to claim 21 wherein a coupling means is provided with which the amplitude of the image signal can be sent to the noise signal amplifier.

23. The circuit according to claim 17, wherein said controlling means is operative to modulate the laser beam produced by the laser diode.

24. An apparatus for the intensity adjustment of a laser beam generated by a laser diode, comprising:
    means for controlling a laser diode with an adjustment signal; and
    means for controlling a laser diode with a noise signal,
    wherein the noise signal exhibits an effective current strength $I_{eff}$ in which $I_{eff} > c/(S_{FM} \cdot L_{ext})$ where c designates the speed of light, $S_{FM}$ designates the frequency modulation efficiency of the laser diode, and $L_{ext}$ designates the distance between the laser diode and the first, at least partially reflective surface outside the laser diode which acts upon the laser beam.

25. A method for imaging a photosensitive recording medium with a laser diode, in an imaging system having an imaging bandwidth, comprising the steps of:
    providing an adjustment signal for controlling a laser diode; and
    providing a noise signal generator for generating a noise signal controlling the laser diode, the noise signal having signal components outside the imaging bandwidth,
    such that a composite control signal is received by the laser diode, and wherein a modified laser output is generated with suppressed mode-hop induced power fluctuations within the imaging bandwidth; and directing the modified laser output toward a recording medium.

26. The method according to claim 25, wherein the adjustment signal is a modulation signal representing an image to be recorded.

27. The method according to claim 25, wherein the adjustment signal comprises image scan data, wherein the signal components of the noise signal are higher infrequency than an upper limit of the imaging bandwidth.

28. The method according to claim 25, wherein the adjustment signal comprises an image signal defining a desired modulation of the laser diode output within the imaging bandwidth, further comprising the step of controlling the laser diode with the image signal and the noise signal, to suppress mode hop interference with a recording of the image on a photosensitive recording medium while producing a laser output representing the image signal within the imaging bandwidth and a noise signal having signal components outside the imaging bandwidth.

29. The method according to claim 25, wherein the laser diode is subject to mode hops having a characteristic frequency, the noise signal having a broadband spectrum including energy at the characteristic frequency.

30. The method according to claim 25, wherein the laser diode is inherently subject to mode hops within the imaging bandwidth, relating to optical feedback to the laser diode having at least one minimum characteristic timeconstant, the noise signal having a broadband spectrum including sufficient energy at a frequency corresponding to a reciprocal of the at least one minimum timeconstant to suppress the mode hop induced power fluctuations having signal components within the imaging bandwidth.

31. The method according to claim 25, wherein the laser diode is subject to mode hops due to an external parasitic resonator, causing undamped laser oscillations at a characteristic frequency of the external parasitic oscillator, the noise signal having a broadband spectrum including energy at the characteristic frequency.

32. The method according to claim 25, wherein the noise signal has an energy bandwidth sufficient for suppressing mode hop induced power fluctuations of the laser output which interfere with the recording of the image signal on the recording medium, while not itself interfering with the recording of the image signal on the recording medium.

33. The method according to claim 25, wherein the noise signal exhibits an effective current amplitude $I_{eff}$ in which $I_{eff} > c/(S_{FM} \cdot L_{ext})$, wherein c designates the speed of light, $S_{FM}$ the frequency modulation efficiency of the laser diode, and $L_{ext}$ a distance between the laser diode and a closest surface outside of the laser diode which at least partially reflects a laser output of the laser diode.

34. The method according to claim 25, wherein the noise signal is a band-pass signal whose lower limit frequency is greater than the upper limit frequency of the adjustment signal.

35. The method according to claim 25, wherein the noise signal comprises frequencies having energy between about 20 MHz and 50 MHz.

36. The method according to claim 25, wherein the adjustment signal is a static signal.

37. The method according to claim 25, wherein the noise signal is selectively clocked as a function of time within the composite signal.

38. The method according to claim 25, wherein the noise signal is applied discontinuously to control the laser diode.

39. The method according to claim 25, wherein the noise signal is gated as a function of time to control the laser diode.

40. The method according to claim 25, further comprising the step of controlling the laser diode with the composite signal including a sum signal formed by additively superimposing the adjustment signal and the noise signal in a frequency-selective superpositioning circuit.

41. The method according to claim 25, wherein the adjustment signal and the noise signal are combined serially to form the composite signal.

42. The method according to claim 25, wherein the adjustment signal and the noise signal are combined in parallel to form the composite signal.

43. The method according to claim 25, further comprising the step of scanning the laser output of the laser diode as a function of time.

44. The method according to claim 25, wherein a laser diode output has a path length which varies over time.

45. The method according to claim 25, wherein a laser output of the laser diode is partially coupled, by means of an element external to the laser diode, back into an active zone of the laser diode.

46. The method according to claim 25, wherein an amplitude of the noise signal is controlled based on amplitude of the modulation signal.

47. The method according to claim 25, further comprising the step of receiving an image signal, wherein both the noise signal and the adjustment signal are controlled based on the image signal and a predetermined characteristic relation between an amplitude of the adjustment signal and a desired amplitude of the noise signal.

48. An apparatus for controlling a laser diode in an imaging device employing a laser output of the laser diode to illuminate an image recording medium, the laser diode having a laser output subject to mode-hop induced power fluctuations during excitation, comprising:
   means for adjusting a desired pattern of laser output intensity of a laser diode within an imaging bandwidth;
   a noise signal generator, generating a noise signal having a signal frequency component greater than said imaging bandwidth;
   means for exciting the laser diode with a current dependent on said desired pattern of laser output intensity and said generated noise signal, such that mode hop induced power fluctuations having effective signal components within said imaging bandwidth are suppressed.

49. The apparatus according to claim 48, wherein said desired pattern of laser output intensity comprises an image recording scan signal.

50. The apparatus according to claim 48, wherein said desired pattern of laser output intensity comprises a static intensity pattern.

51. The apparatus according to claim 48, further comprising a signal mixer comprising a low pass filtered input for said desired pattern of laser output intensity and a high-pass filtered input for said noise signal, and means additively superimposing said low pass and high pass signals.

52. The apparatus according to claim 48, wherein said desired pattern of laser output intensity and noise signal are provided as electrical signals having a common reference potential.

53. The apparatus according to claim 48, further comprising a controllable gain amplifier for modulating an amplitude of said noise signal.

54. The apparatus according to claim 48, wherein said noise signal is controlled based on a predetermined relation between a desired noise signal characteristic and an amplitude of said desired pattern of laser output intensity.

55. The apparatus according to claim 48, wherein said noise signal does not include substantial components within said imaging bandwidth.

56. The apparatus according to claim 48, further comprising a closest at least partially reflective surface disposed within the path of said laser diode output, reflecting a portion of said laser output back into said laser diode, wherein said noise signal exhibits an effective current amplitude $I_{eff}$ in which $I_{eff} > c/(S_{FM} \cdot L_{ext})$, wherein c designates the speed of light, $S_{FM}$ the frequency modulation efficiency of the laser diode, and $L_{ext}$ a distance between the laser diode and said closest surface outside of the laser diode.

57. The apparatus according to claim 48, further comprising a scanner for scanning said laser diode output over a two-dimensional image recording medium as a function of time.

58. The apparatus according to claim 48, wherein said laser diode output has a path length which varies over time.

* * * * *